(12) United States Patent  
Berg et al.

(10) Patent No.: US 8,913,402 B1
(45) Date of Patent: Dec. 16, 2014

(54) TRIPLE-DAMASCENE INTERPOSER

(75) Inventors: John E. Berg, Palo Alto, CA (US); Douglas R. Hackler, Sr., Boise, ID (US)

(73) Assignee: American Semiconductor, Inc., Boise, ID (US)

(*) Notice: Subject to any disclaimer, the term of this patent is extended or adjusted under 35 U.S.C. 154(b) by 269 days.

(21) Appl. No.: 13/112,450

(22) Filed: May 20, 2011

Related U.S. Application Data

(60) Provisional application No. 61/346,770, filed on May 20, 2010.

(51) Int. Cl.
  *H05K 1/11* (2006.01)
  *H05K 7/00* (2006.01)
  *H05K 1/18* (2006.01)
  *H05K 1/00* (2006.01)

(52) U.S. Cl.
  USPC ........... 361/804; 361/760; 361/761; 361/803; 174/250; 174/261

(58) Field of Classification Search
  USPC ......... 174/250, 253, 254, 255, 258, 260, 261, 174/262, 264, 265, 266; 361/760, 761, 762, 361/763, 768, 771, 766, 767, 792, 793, 794, 361/795, 803, 804; 438/110, 125, 126; 257/700, E23.178
  See application file for complete search history.

(56) References Cited

U.S. PATENT DOCUMENTS

| | | | |
|---|---|---|---|
| 5,386,627 A | 2/1995 | Booth et al. | |
| 5,404,044 A | 4/1995 | Booth et al. | |
| 5,759,047 A | 6/1998 | Brodsky et al. | |
| 5,984,691 A | 11/1999 | Brodsky et al. | |
| 6,270,363 B1 | 8/2001 | Brofman et al. | |
| 6,617,681 B1 | 9/2003 | Bohr | |
| 6,671,947 B2 | 1/2004 | Bohr | |
| 6,791,035 B2 | 9/2004 | Pearson et al. | |
| 6,952,049 B1* | 10/2005 | Ogawa et al. | 257/700 |
| 7,034,401 B2 | 4/2006 | Savastiouk et al. | |
| 7,060,601 B2 | 6/2006 | Savastiouk et al. | |
| 7,763,965 B2 | 7/2010 | Webb | |
| 2002/0195700 A1* | 12/2002 | Li | 257/700 |
| 2006/0081478 A1* | 4/2006 | Sahoda et al. | 205/148 |
| 2006/0202322 A1* | 9/2006 | Kariya et al. | 257/698 |
| 2006/0263937 A1* | 11/2006 | Fukase et al. | 438/108 |
| 2007/0154741 A1* | 7/2007 | Takahashi et al. | 428/901 |
| 2008/0200002 A1* | 8/2008 | Suzuki et al. | 438/381 |
| 2009/0173522 A1 | 7/2009 | Sakamoto et al. | |
| 2009/0173530 A1 | 7/2009 | Sakamoto et al. | |
| 2009/0231827 A1 | 9/2009 | Furutani et al. | |

* cited by examiner

*Primary Examiner* — Hoa C Nguyen
*Assistant Examiner* — Binh Tran
(74) *Attorney, Agent, or Firm* — Your Intellectual Property Matters, LLC; Robert A. Frohwerk

(57) ABSTRACT

This interposer provides interconnections between stacked layers of circuits, which may include integrated circuits, PC boards, and hybrid substrates. Fabricated as an integrated circuit itself using readily available process steps, this interposer uses single and dual-damascene layers to increase the density of usable interconnections on both its top and bottom surfaces. Access from a top surface to a bottom surface is provided by conductive through-vias that may be placed at a high density. For even greater density, interconnections may be routed within silicon trenches, while damascene processing reduces the total number of steps required for fabrication. The described techniques may be used to create double-sided integrated circuits.

14 Claims, 3 Drawing Sheets

Process Flow

| | |
|---|---|
| 300 | Silicon substrate starting material |
| 310 | Damascene Etch for top T1 trench |
| 320 | Dielectric deposition or oxidation of silicon |
| 330 | Liner deposition(s) |
| 340 | Copper Plate |
| 350 | Copper CMP T1 |
| 370 | Top ILD layer |
| 380 | Fabricate TV1 contact openings in top protective layer |
| 385 | Top M1 interconnect with via fabrication M1 and above |
| 390 | Temporary bond top layer to mechanical substrate |
| 400 | Thin backside |
| 410 | Etch DTSV |
| 420 | Etch bottom B1 damascene trench |
| 430 | Dielectric deposition or oxidation of silicon |
| 440 | Liner deposition(s) |
| 450 | Copper Plate |
| 460 | Copper CMP B1 |
| 480 | Bottom ILD layer |
| 490 | Fabricate BV1 contact openings in bottom protective layer |
| 495 | Bottom M1 interconnect with via fabrication M1 and below |
| 500 | Release from mechanical substrate |

FIG. 3

TRIPLE-DAMASCENE INTERPOSER

CROSS-REFERENCES TO RELATED APPLICATIONS

This application claims benefit of U.S. Provisional Application No. 61/346,770 filed May 20, 2010, entitled "Triple-Damascene Interposer", which is incorporated here by reference in its entirety.

FIELD OF THE INVENTION

The present invention relates generally to interconnectors for microelectronic circuits. In particular, this invention is an interface that integrates two or more integrated circuits into a stacked three-dimensional structure.

BACKGROUND OF THE INVENTION

An interposer is a device that is used as an interface to provide interconnections between two or more integrated circuits to produce a stacked three-dimensional structure. Individual IC's, printed circuit boards and hybrid substrates, each being an electronic subsystem, may be connected using an interposer to form a more complex system.

BRIEF DESCRIPTION OF THE DRAWINGS

The particular features and advantages of the devices and methods described here will become apparent when taking the following description in conjunction with one or more of the accompanying FIGS. 1-3 of the drawings:

FIG. 3 shows a process flow diagram for fabrication of an interposer.

Figure 1:
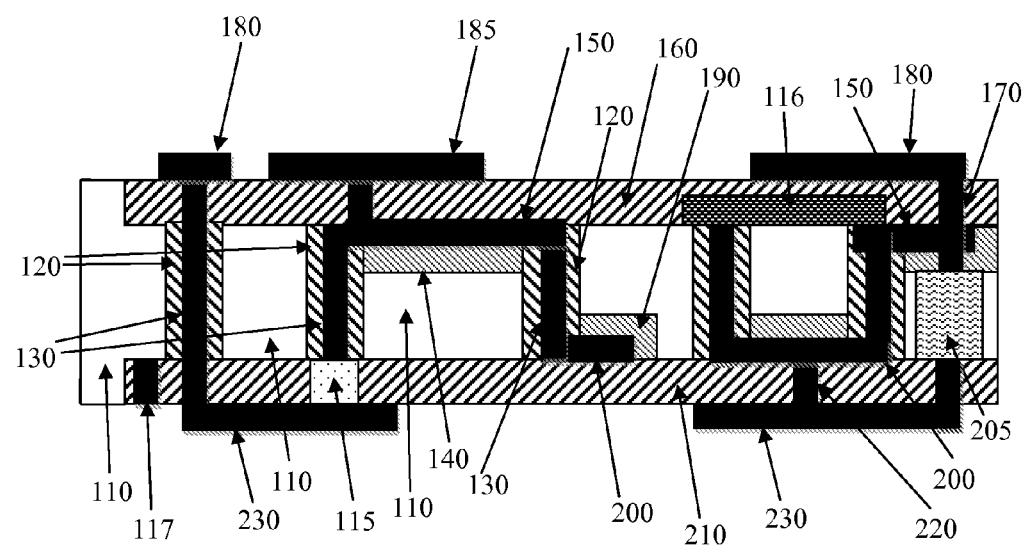
FIG. 1 is a cross-sectional view of an interposer as described here.
Figure 2:
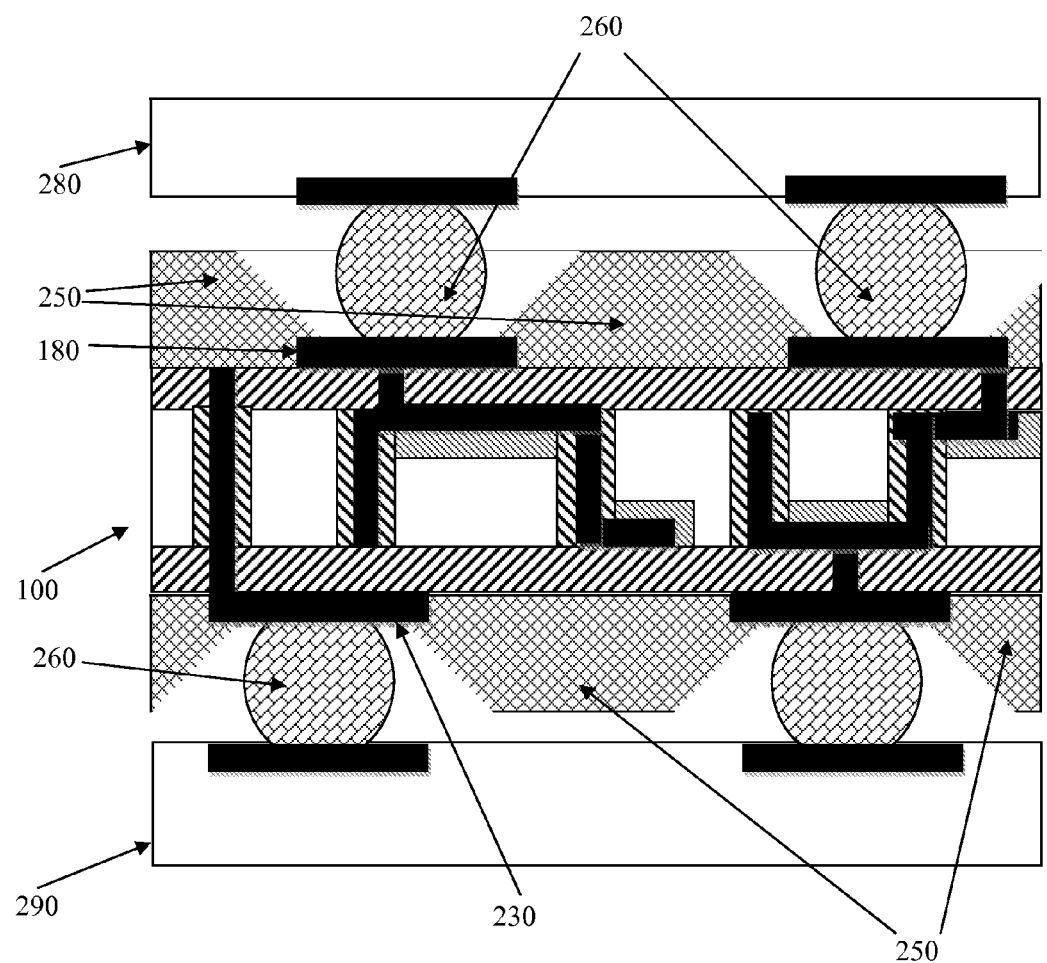
FIG. 2 illustrates the interposer in use to provide connections between a memory device and a logic device.

The following Reference Numbers may be used in conjunction with one or more of the accompanying FIGS. 1-3 of the drawings:
100 Interposer device
110 Substrate of silicon, quartz or semiconductor
120 DTSV, Dual-damascene Through-Silicon Via
130 Via Fill
140 Damascene top trench
150 Damascene T1 top interconnect
160 Top ILD
170 TV1 Top Via
180 TM1 Top interconnect
190 Dual-damascene bottom trench
200 Dual-damascene B1 bottom interconnect
210 Bottom ILD
220 BV1 Bottom Via
230 BM1 Bottom interconnect
250 Pad Passivation layer
260 Connective bond
280 Logic Function Integrated Circuit
290 Memory Function Integrated Circuit

DETAILED DESCRIPTION OF THE INVENTION

An interposer is an interface chip that is used to make electrical connections for integration of two or more integrated circuits into a stacked three-dimensional structure where each individual chip is connected to form an electronic system. In addition to traditional integrated circuitry, the presently described interposer accommodates connectivity between less traditional subsystems such as MEMS (Micro-Electro-Mechanical Systems) as well as less exotic technologies in the form of PC boards and hybrid substrates.

The presently described interposer takes advantage of damascene processing. Though well-known by those skilled in the art, a brief review is offered here. Damascene processing involves the unpatterned deposition of a dielectric material which is then patterned and etched to produce holes and/or trenches. The surface is then filled, generally with copper, after which the damascene (copper) layer is removed, generally by CMP, to leave a smooth surface. Optionally, a thin barrier film may be applied prior to the copper to prevent diffusion of copper into the dielectric. In a single damascene process, copper is deposited into the holes or trenches, with the result being that when filled the holes become conductive vias, and metal-filled trenches become wire lines for routing of interconnections. For dual-damascene processing both holes and trenches are fabricated, to different depths, before the deposition of copper. This results in the simultaneous formation of both conductive vias and wire lines for interconnection routing, which reduces the number of processing steps.

Refer to FIG. 1 for details of the described interposer device which is constructed using a dual-damascene process. The damascene layers connect the circuits on the two sides of the interposer by providing a path for current to flow from the top interconnects (TM1, 180) at the top surface of the substrate 110 to the bottom interconnects (BM1, 230) at the bottom surface of the substrate. The vias are filled with a conductive core 130 which may include a barrier layer surrounded by an insulator.

The two-sided interconnects of the interposer provide for routing so that the circuitry that is mounted above the interposer can be connected to that which is mounted below it to enable integration in three dimensions (3-D). This routing capability accommodates matching between the one or more IC's above the interposer to those below it, even though the two sets of circuitry may have different pad layouts. Beginning with a semiconductor substrate 110, a damascene metal process is used to form top layer damascene metal that is routed in trenches in the substrate 110 to serve as a top interconnect (150) layer. Fabricating the top trench 140 in the top of the substrate rather than in a dielectric layer on top of the substrate reduces the overall thickness of the device which increases its flexibility. Dual-damascene bottom interconnect layer (200) and conductive core (130) layers are formed respectively by filling of the bottom trench 190 and the Through-Silicon Via (TSV, 120).

In addition to serving as a routing layer, the top interconnect layer includes top contacts for making electrical connections to a circuit above the interposer, while the bottom interconnect layer provides another routing layer that includes bottom contacts for connection to a circuit below. The top interconnect 150 at the damascene T1 layer comprises a conductive material and may include a barrier layer surrounded by an insulator. This is covered with ILD (Inter-Layer Dielectric, 160). The damascene B1 bottom interconnect 200 and the conductive core (130) are constructed in a similar manner with the option to wrap the conductive material with a barrier layer surrounded by an insulator. Bottom interconnects 200 are protected by additional bottom ILD 210.

Silicon is the most common substrate, but the presently described design need not be so restricted as quartz or other semiconductor materials are viable alternatives. By utilizing the substrate for more than just TSV (120), this structure significantly reduces the thickness required for the interposer, saving the combined thickness of two dielectric layers plus two metal layers. The trench-routed damascene and dual-damascene metal provides for the routing of local interconnections and through-silicon vias for structures such as resistors (115), diodes (205), transistors (116), capacitors (185) and inductors (117) that may be fabricated within the interposer substrate. The integration of resistors, diodes, transistors, capacitors and inductors is accommodated on the top side, bottom side and in the damascene layers of the interposer. Damascene layers facilitate integration of non-silicon materials that include a variety of ceramics, ferroelectrics, chalcoginides, magnetic materials, metals and dielectrics, among others.

The connection of damascene metal for the top interconnect 150 to the via fill 130 provides for routing of TSV connections at the substrate level. Furthermore, this provides local routing to the backside TSV at the substrate level which has not been available with previous techniques.

Thinning of the substrate facilitates the use of TSV to connect two separated layers of routing, namely, T1 top interconnects 150 with B1 bottom interconnects 200, at opposite sides of the substrate. By thinning the silicon substrate to less than 40 μm, the interposer gains the advantage of flexibility.

One factor that contributes to maintaining a thin interposer is the precise uniformity of depth of the TSV's across the circuit. This is achieved by using a damascene trench on one side of the wafer as an etch stop when through-silicon vias are etched in the silicon substrate from the other side of the wafer. This will be discussed in greater detail in relation to the process steps below.

Previously available structural techniques may have allowed TSV to be used for through-wafer connections, and multiple-layer interconnects could be fabricated on the top side of the substrate. However, the presently described structure advances beyond those techniques, providing for a vast array of interconnects. Top (TM1, 180) interconnects are similar to Local Interconnects in a Silicon Integrated Circuit. Additionally, interconnects are available in the B1 bottom dual-damascene layer for the bottom interconnects 200, where there may be bottom interconnects and interconnect routing. For even more capacity, multiple layers of interconnects may be fabricated on the bottom of the substrate as well as on the top.

An example of one use of the interposer is shown in FIG. 2. Here an integrated circuit containing logic functions 280 is connected to another integrated circuit that supplies memory functionality 290 with an interposer 100 as the intermediary. At each layer contacts between the functional blocks are made through connective devices 260 such as ball bonds, or other features that are commonly used to supply external connections. Regions 250 on the surfaces of the interposer that are between contacts may be passivated.

The upper layer interconnects of the interposer can provide complex routing to devices that may be integrated into the top of the interposer itself as well as to single or multiple IC's mounted on the top layer of the interposer. In a similar manner, the bottom layer interconnects provide complex routing to devices integrated into the bottom of the interposer and to single or multiple IC's mounted on the bottom layer. The top and bottom M1 interconnects, whether they are single or multiple layers, contact through T1, B1 and TSV. This provides current paths between devices that are integrated into, or mounted at, the top of the interposer and those devices integrated into, or attached at, the bottom of the interposer. The presently described technique makes available a myriad of connections by virtue of the top and bottom damascene interconnects being connected by TSV.

With reference to FIGS. 1 and 3, one method of fabrication begins at step 300 with a substrate 110 of silicon, or other appropriate semiconductor material, to which a damascene etch process is applied at step 310. Furthermore, if desired, semiconductor devices may be fabricated in the top of the interposer substrate prior to the damascene etch of step 310. It is to be noted that the damascene etch is into the silicon which reduces the overall thickness of the device when completed.

Deposition of a top dielectric into the top trench 140 follows in step 320. In the common case of a silicon interposer, this step is replaced by oxidation. One or more liner depositions (330) are then made after which a copper plate is applied (340) prior to polishing by a CMP (Chemical Mechanical Polishing) step 350 to complete the T1 phase.

Steps 370-385 cover fabrication of the top M1 (Metal 1) interconnects. A top ILD 160 layer is added at step 370. Contact openings including Top Vias (TV1, 170) are installed through the top ILD 160 in step 380. Then the Top Vias 170 are filled as the top ILD 160 is overlaid at step 385 with Top Interconnects (TM1, 180) that may be used for bond pads. Optionally, other processes may be included here for additional layers above the top M1 layer. At this point in the process, the top layer of the structure is temporarily bonded (step 390) to a mechanical substrate for further handling.

The backside is then thinned (step 400) toward a reduction in overall thickness of the interposer. Thinning the silicon substrate to less than 40 μm results in an interposer that is flexible so as to better conform to the circuits to which it will be adjoined. After thinning, dual-damascene vias and trenches are etched (at steps 410 and 420) into the bottom of the substrate. Similar to the corresponding steps at the top side, recessing these features into the silicon keeps the interposer thin and contributes to its flexibility.

An advantage of the presently described method is that the use of a dual-damascene etch process provides for simultaneous creation of the metal in the DTSV 120 and the B1 bottom trench 190.or the T1 top trench 140. This reduces the number of process steps to build an interposer. It is to be noted that the bottom DTSV and B1 dual-damascene structures, etched here at steps 410 and 420, may be etched prior to the topside damascene etch of the top trench 140 at step 310 instead of here.

An additional benefit is gained from the fact that the damascene trench on one side of the wafer is lined with a dielectric, an oxide, as part of the damascene interconnect process. By using etches that are selective to a hardmask, generally an oxide, this dielectric becomes an etch stop as through-silicon vias are etched in the silicon substrate from the other side of the wafer. The presence of the oxide in the trench at the precise depth needed to stop the TSV etch optimizes the uniformity of TSV's across the circuit by providing a precision etch stop prior to the surface of the substrate.

Deposition of a bottom dielectric into the DTSV 120 and the B1 bottom trench 190 follows in step 430. One or more liner depositions are placed in step 440. Similar to the previous process steps at the top side of the interposer, a copper layer is plated and polished by CMP at steps 450 and 460, respectively.

While copper is commonly used for the TSV and various interconnects, other materials may also be used. It is necessary that the material selected for these elements be conductive, but any of a wide variety of degeneratively doped semiconductors, metals, or metal-like materials may be used. Potential candidates may be chosen from, but are not restricted to, aluminum, gold, silver, titanium, titanium nitride, aluminum, tantalum nitride, aluminum alloys, metal-silicides and metal-like materials.

The dielectric used for the TSV and interconnects in the presently described device is SiO$_2$ (Silicon Oxide). In general, dielectrics must be insulating, but can be chosen from any of a wide variety of dielectric materials, such as, but not limited to Si$_3$N$_4$ (Silicon Nitride) and Al$_2$O$_3$ (Aluminum Oxide) or any of a wide variety of low-k dielectrics.

The process continues with fabrication of interconnects for the bottom M1 features and above. A bottom ILD 210 layer is applied at step 480. Contact openings (BV1 Bottom Via, 220) are inserted into the bottom ILD layer at step 490. Bottom interconnects (BM1, 230) are then created with support of the dual-damascene process which is used here. The Bottom Vias 220 and Bottom interconnects BM1 230 are filled with metal at step 495. BM1 layers can also be used as bond pads. Process steps similar to these may be repeated here to optionally add layers below the bottom M1 layer. At this point, the interposer is complete and ready to be released from its temporary mechanical substrate (500).

Contributing to the versatility of the presently described interposer is the fact that both top and bottom layers at M1 and above may include MEMS (Micro-Electro-Mechanical Systems) devices. This capability expands the utility of such an interposer as this beyond that of electronic systems of IC's alone for incorporation into mechanical systems with self-contained control circuitry, giving new meaning to the term 'hybrid'.

For a simpler system, another extreme allows for the presently described interposer to be constructed without interconnects other than the TSV (120), and the T1 Top interconnects (150) and B1 Bottom interconnects (200). However, those features are necessary and the absence of any of them would prevent the interposer from working properly. In other applications, instead of using the interposer for 3-D integration of multiple circuit dice, it could be used as part of the IC fabrication process to construct IC's having interconnects on both sides of the die.

Although the interposer as described here uses a silicon substrate, any substrate that provides a solid mechanical foundation may be used in a similar manner, especially quartz or another semiconductor material. Furthermore, references here to a Through-Silicon Via, or TSV, should be considered more generally as a conductive via to include various combinations of substrate and conductive materials.

Though the present description has made reference to particular implementations, various modifications will be apparent to those skilled in the art. Therefore, it is not intended that the described devices and methods be limited to the disclosed implementations or their details, as variations can be made within the spirit and scope of the appended claims.

What is claimed is:

1. An interposer for electrical connection of a first circuit to a second circuit, the interposer comprising:
    a semiconductor substrate having a thickness of less than 40 μm;
    a first top interconnect layer in a top surface of the substrate;
    at least one top contact in the first top interconnect layer;
    a first bottom interconnect layer in a bottom surface of the substrate;
    at least one bottom contact in the first bottom interconnect layer; and
    at least one conductive via extending through the substrate,
    wherein the at least one conductive via is connected to the at least one top contact and to the at least one bottom contact, and
    wherein one or more integrated circuits are fabricated in at least the top surface or the bottom surface of the substrate, the one or more integrated circuits including one or more devices, and
    wherein the first top interconnect layer makes one or more connections between the one or more devices in the top surface, and
    wherein the first bottom interconnect layer makes one or more connections between the one or more devices in the bottom surface, and
    wherein the at least one conductive via connects at least one of the one or more devices in the top surface with at least one of the one or more devices in the bottom surface, and
    wherein the interposer conforms for electrical coupling to the first circuit above the interposer, and the interposer conforms for electrical coupling to the second circuit below the interposer, and
    wherein the interposer is flexible and compliant.

2. The interposer of claim 1, wherein the first top interconnect layer is a first routing layer to adapt for electrical coupling to the first circuit, and
    the first bottom interconnect layer is a second routing layer to adapt for electrical coupling to the second circuit.

3. The interposer of claim 1, wherein at least one of the first top interconnect layer or the first bottom interconnect layer is formed by a damascene metal process and connects to the at least one conductive via.

4. The interposer of claim 1, further comprising at least one trench in the substrate, wherein a damascene metal process forms an interconnect which is routed in the trench.

5. The interposer of claim 1, wherein one of the first top interconnect layer or the first bottom interconnect layer is formed by a dual-damascene process which creates at least one trench in the substrate, and
    wherein dual-damascene metal in the at least one trench is connected to the at least one conductive via.

6. The interposer of claim 1, wherein the first bottom interconnect layer includes at least one metal-filled trench in the substrate which connects to the at least one conductive via, the at least one metal-filled trench being formed by a dual-damascene process, whereby local routing is provided in the substrate.

7. The interposer of claim 6, wherein the first top interconnect layer comprises damascene metal which interconnects to the at least one conductive via,
    whereby two layers of routing, specifically, the first top interconnect layer and the first bottom interconnect layer, are connected in the substrate.

8. The interposer of claim 1, wherein damascene metal is connected to the at least one conductive via to provide local routing in the substrate.

9. The interposer of claim 1, further comprising:
    a top ILD (Inter-Layer Dielectric) above the first top interconnect layer;
    one or more top vias through the top ILD; and
    a second top interconnect layer above the top ILD.

10. The interposer of claim 1, further comprising:
    a bottom ILD below the first bottom interconnect layer;
    one or more bottom vias through the bottom ILD; and
    a second bottom interconnect layer below the bottom ILD.

11. The interposer of claim 1, further comprising at least one structure selected from resistors, capacitors, inductors, diodes or transistors,
    wherein the structure is fabricated in the substrate and connected to at least one of the first top interconnect layer or the first bottom interconnect layer.

12. The interposer of claim 11, wherein the structure is connected to both of the first top interconnect layer and the first bottom interconnect layer.

13. The interposer of claim 1, wherein the at least one conductive via comprises a conductive core surrounded by a barrier layer.

14. The interposer of claim 1, wherein the at least one conductive via comprises a conductive core surrounded by a barrier layer and an insulator.

* * * * *